(12) United States Patent
Miyoshi et al.

(10) Patent No.: US 10,928,037 B2
(45) Date of Patent: Feb. 23, 2021

(54) LIGHT EMITTING DEVICE

(71) Applicant: NICHIA CORPORATION, Anan (JP)

(72) Inventors: Tomonori Miyoshi, Tokushima (JP); Kenji Ozeki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/751,920

(22) Filed: Jan. 24, 2020

(65) Prior Publication Data

US 2020/0158314 A1 May 21, 2020

Related U.S. Application Data

(63) Continuation of application No. 15/407,476, filed on Jan. 17, 2017, now Pat. No. 10,578,279.

(30) Foreign Application Priority Data

Jan. 19, 2016 (JP) .................................. 2016-008351

(51) Int. Cl.
*F21V 9/30* (2018.01)
*F21V 3/06* (2018.01)
*H01L 33/50* (2010.01)
*H01L 25/075* (2006.01)
*F21V 13/08* (2006.01)
*F21V 15/01* (2006.01)
*F21V 19/00* (2006.01)
(Continued)

(52) U.S. Cl.
CPC ................ *F21V 9/30* (2018.02); *F21V 3/062* (2018.02); *F21V 13/08* (2013.01); *F21V 15/01* (2013.01); *F21V 19/003* (2013.01); *H01L 25/0753* (2013.01); *H01L 33/486* (2013.01); *H01L 33/505* (2013.01); *F21Y 2115/10* (2016.08); *H01L 33/54* (2013.01); *H01L 2933/005* (2013.01); *H01L 2933/0041* (2013.01)

(58) Field of Classification Search
CPC .......... F21V 9/30; F21V 19/003; F21V 15/01; F21V 3/062; H01L 33/486; H01L 33/505; H01L 25/0753; H01L 33/54; H01L 2933/005; H01L 2933/0041; F21Y 2115/10
See application file for complete search history.

(56) References Cited

U.S. PATENT DOCUMENTS 9,343,444 B2   5/2016   Tischler et al.
9,869,432 B2   1/2018   Keller et al.
(Continued)

FOREIGN PATENT DOCUMENTS

JP   2009164157 A   7/2009
JP   2013118284 A   6/2013
(Continued)

*Primary Examiner* — Peggy A Neils
(74) *Attorney, Agent, or Firm* — Hunton Andrews Kurth LLP

(57) ABSTRACT

A light emitting device is disclosed. The light emitting device includes a mounting board, one or more light emitting elements arranged on the mounting board, a frame disposed to surround the one or more light emitting elements, and a light transmissive member encapsulating an area surrounded by the frame. The frame has an inner perimeter that includes at least a pair of opposing sides and four acute-angled portions each provided at each end of the pair of opposing sides, in a plan view.

13 Claims, 19 Drawing Sheets

(51) Int. Cl.
*H01L 33/48* (2010.01)
*H01L 33/54* (2010.01)
*F21Y 115/10* (2016.01)

(56) References Cited

U.S. PATENT DOCUMENTS

| | | |
|---|---|---|
| 10,340,433 B2 * | 7/2019 | Lee ................. H01L 33/647 |
| 2013/0020588 A1 | 1/2013 | Yong et al. |
| 2013/0087822 A1 | 4/2013 | Kim |
| 2013/0101754 A1 | 4/2013 | Shimomura et al. |
| 2013/0134398 A1 | 5/2013 | Yamazaki et al. |
| 2014/0203305 A1 | 7/2014 | Kawano et al. |
| 2015/0198292 A1 | 7/2015 | Jones |
| 2016/0013378 A1 | 1/2016 | Sakamoto et al. |
| 2018/0138377 A1 | 5/2018 | Senuki et al. |

FOREIGN PATENT DOCUMENTS

| | | |
|---|---|---|
| JP | 2013206890 A | 10/2013 |
| WO | 2017013870 A1 | 1/2017 |

* cited by examiner

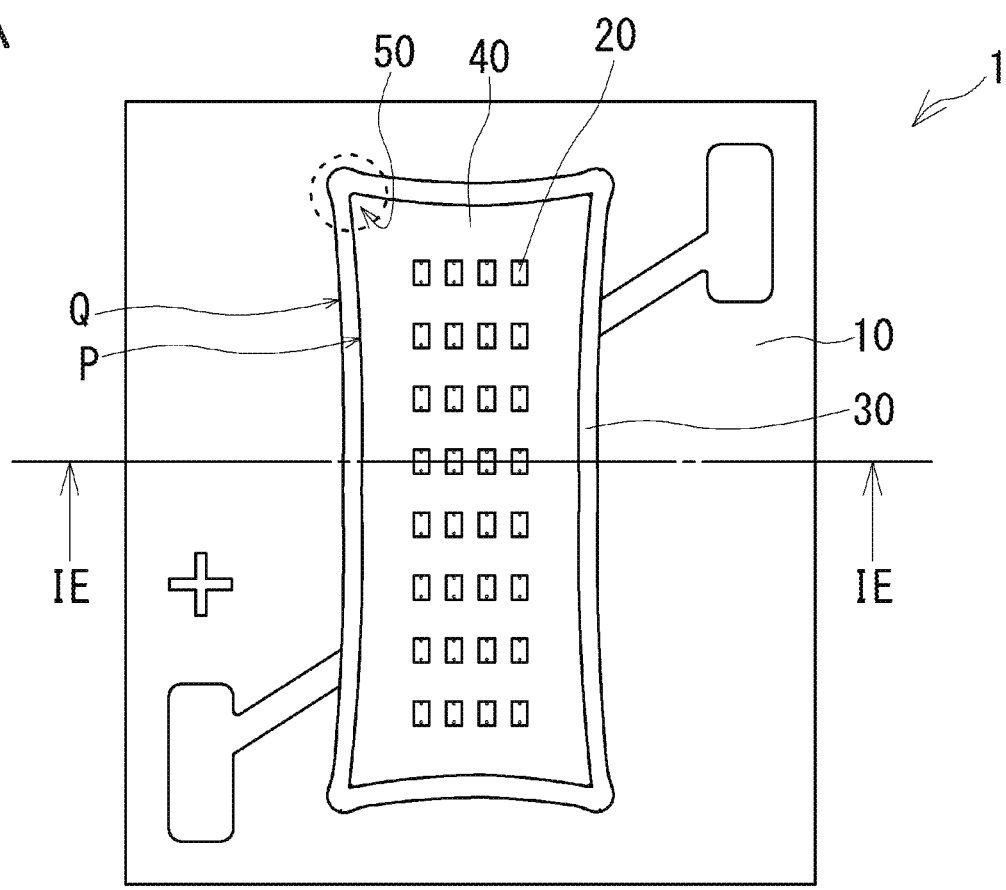

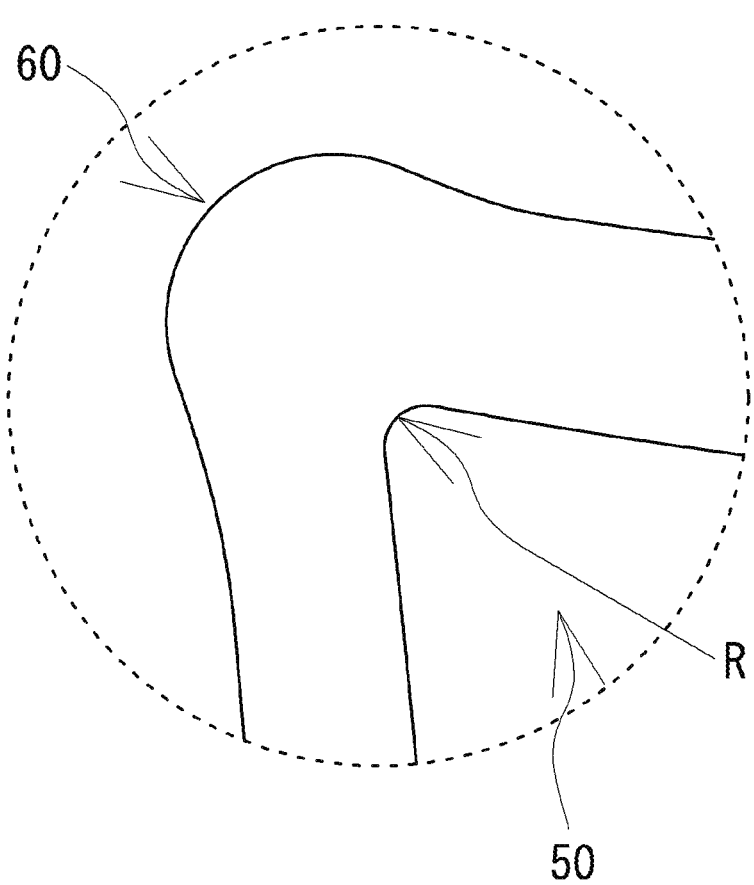

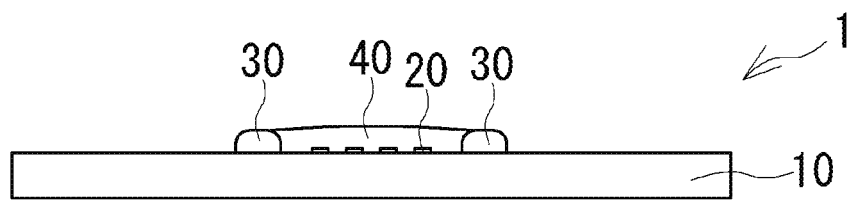

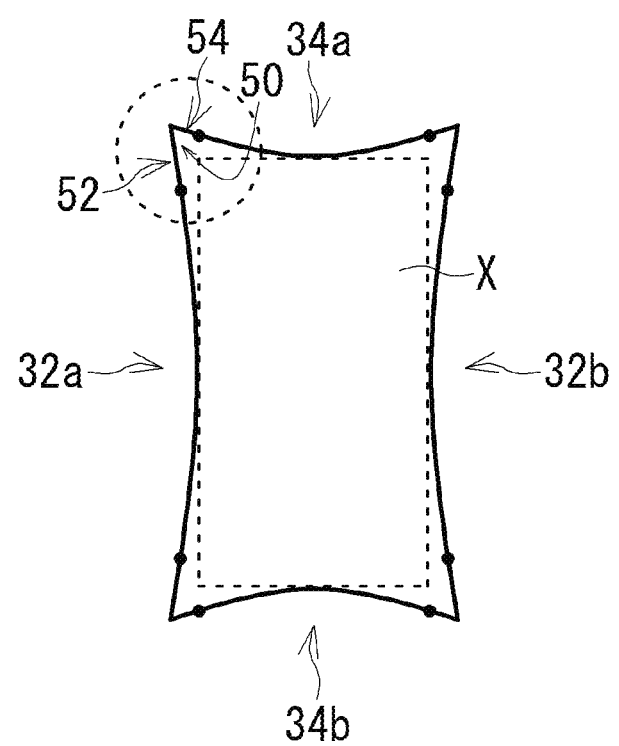

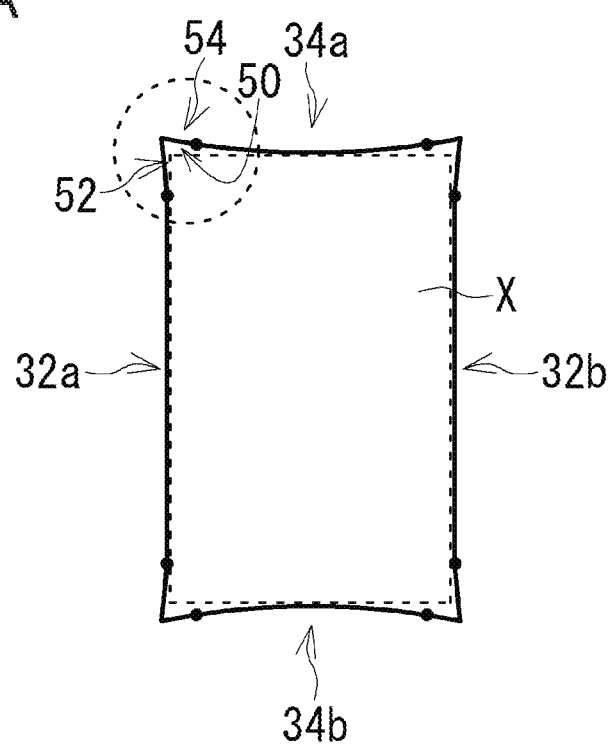

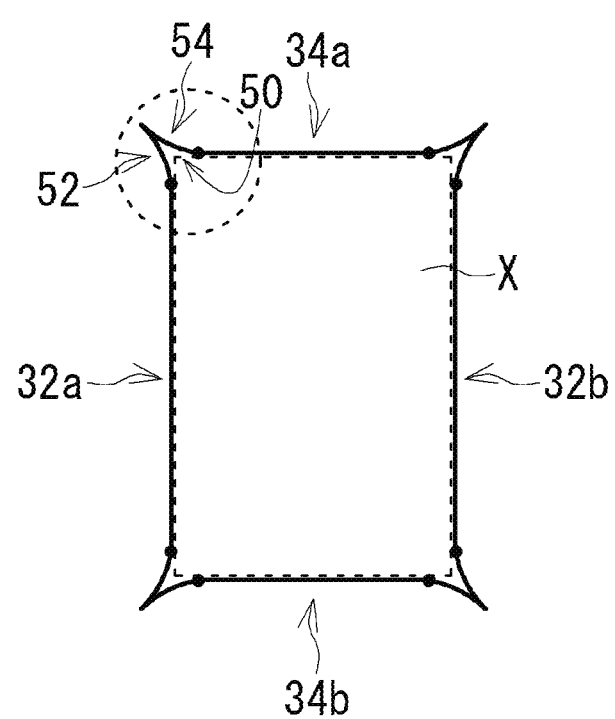

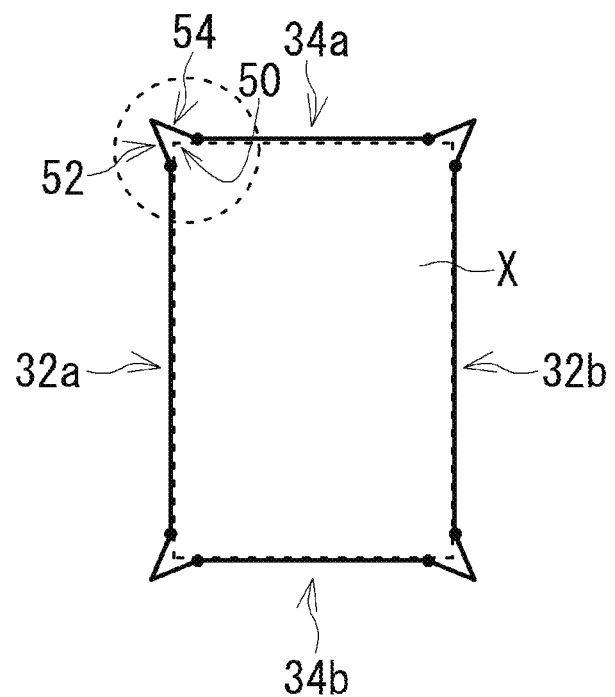

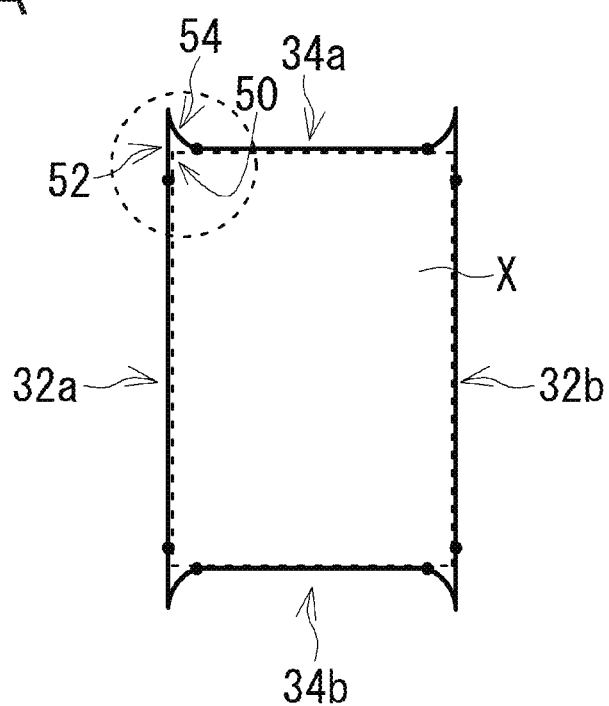

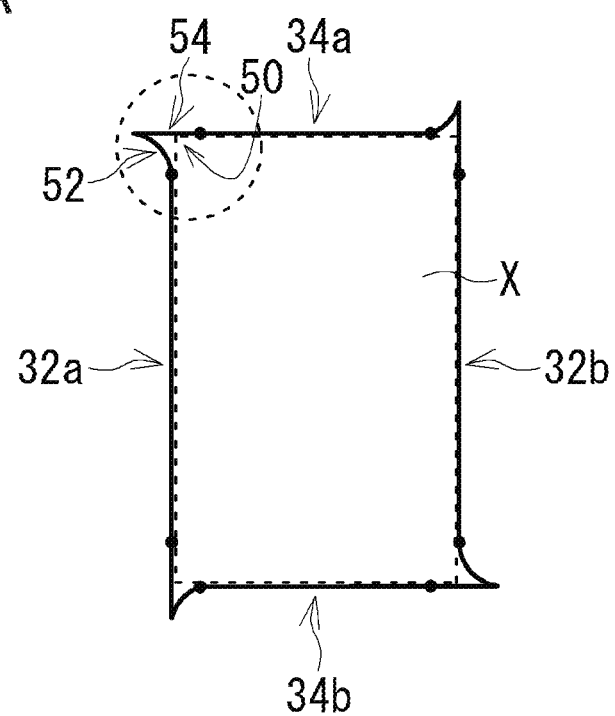

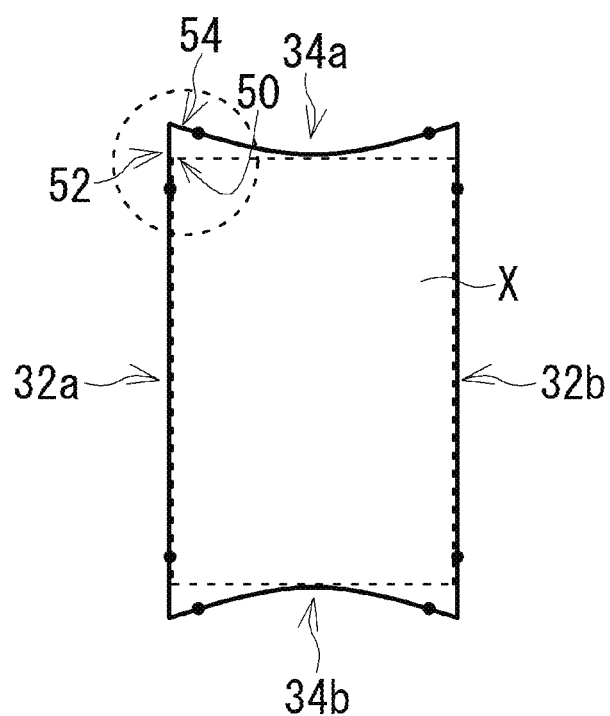

LIGHT EMITTING DEVICE

CROSS-REFERENCE TO RELATED APPLICATION

This is a continuation application of U.S. patent application Ser. No. 15/407,476, filed Jan. 17, 2017, which claims priority to Japanese Patent Application No. 2016-008351, filed on Jan. 19, 2016, the disclosure of which is hereby incorporated by reference in its entirety.

BACKGROUND

The present disclosure relates to light emitting devices.

A light emitting diode module having a mounting board, a plurality of light emitting diode chips mounted on the mounting board, a dam member surrounding the plurality of light emitting diode chips, and a phosphor layer disposed in the area surrounded by the dam member have been known as disclosed in Japanese Unexamined Patent Application Publication No. 2013-118284. The dam member is formed by applying and curing a resin material on the mounting board. The area surrounded by the dam member is an emission surface of the light emitting diode module, which is rectangular in shape in a plan view.

SUMMARY

The resin member prior to curing is fluid in nature. Accordingly, in a conventional light emitting diode module described above, the inside corners of an area surrounded by a dam member, which should be right angled, are rounded, such that an emission area is reduced by the rounded corners.

The object described above can be addressed, for example, by the means described below.

A light emitting device comprising a mounting board, one or more light emitting elements mounted on the mounting board, a frame arranged to surround the one or more light emitting elements, a light transmissive member encapsulating the area surrounded by the frame is provided. The frame has an inner perimeter that includes at least a pair of opposing sides, and four acute-angled portions each provided at both ends of the pair of opposing sides, in a plan view.

According to the light emitting device described above, in a light emitting device having an emission surface surrounded by a frame, a larger approximately rectangular area can be provided for the emission surface.

BRIEF DESCRIPTION OF THE DRAWINGS

FIG. 1A is a schematic plan view of a light emitting device according to a first embodiment (Embodiment 1).

FIG. 1B is an enlarged view of a portion surrounded by a dotted line in FIG. 1A.

FIG. 1E is a sectional view taken along line IE-IE indicated in FIG. 1A.

FIG. 1F is a schematic plan view illustrating a shape of an inner perimeter of a frame in the light emitting device according to Embodiment 1.

FIG. 2A is a schematic plan view illustrating a shape of an inner perimeter of the frame in a light emitting device according to a second embodiment (Embodiment 2).

FIG. 3A is a schematic plan view illustrating a shape of an inner perimeter of a frame in a light emitting device according to a third embodiment (Embodiment 3).

FIG. 4A is a schematic plan view illustrating a shape of an inner perimeter of a frame in a light emitting device according to a fourth embodiment (Embodiment 4).

FIG. 5A is a schematic plan view illustrating a shape of an inner perimeter of a frame in a light emitting device according to a fifth embodiment (Embodiment 5).

FIG. 6A is a schematic plan view illustrating a shape of an inner perimeter of a frame in a light emitting device according to a sixth embodiment (Embodiment 6).

FIG. 7A is a schematic plan view explaining the shape of the inner perimeter of the frame in the light emitting device according to a seventh embodiment (Embodiment 7).

DETAILED DESCRIPTION

Light Emitting Device 1 According to Embodiment 1

Figure 1C:
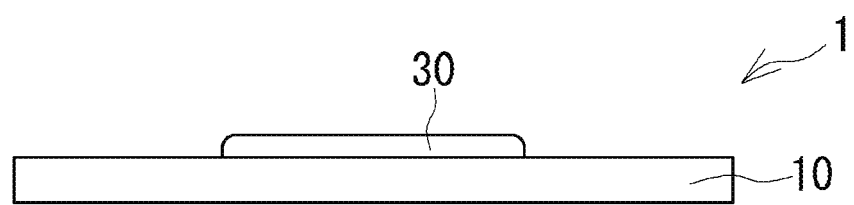
FIG. 1C is a schematic front view of the light emitting device according to Embodiment 1.
Figure 1D:
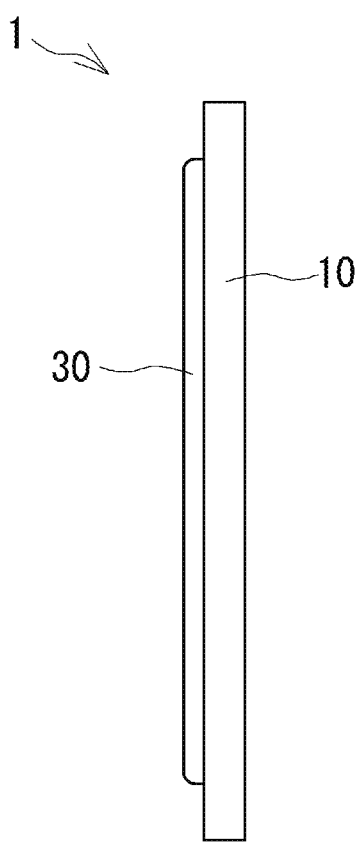
FIG. 1D is a schematic side view of the light emitting device according to Embodiment 1.
Figure 1G:
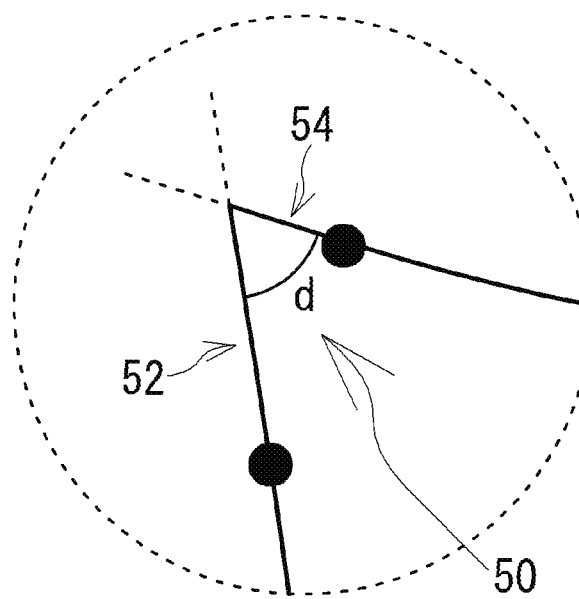
FIG. 1G is an enlarged view of a portion surrounded by a dotted line in FIG. 1F.

FIG. 1A is a schematic plan view of a light emitting device 1 according to Embodiment 1, and FIG. 1B is an enlarged view of a portion surrounded by a dotted line in FIG. 1A. FIG. 1C is a schematic plan view of the light emitting device 1, and FIG. 1D is a schematic lateral side view of the light emitting device 1. FIG. 1E is a sectional view taken along line IE-IE indicated in FIG. 1A. FIG. 1F is a schematic plan view illustrating a shape of an inner perimeter of a frame in the light emitting device 1. FIG. 1G is an enlarged view of a portion surrounded by a dotted line in FIG. 1F.

As shown in FIG. 1A to FIG. 1G, the light emitting device 1 includes a mounting board 10, one or more light emitting elements 20 arranged on the mounting board 10, a frame 30 disposed to surround the one or more light emitting elements 20, and a light transmissive member 40 encapsulating the area surrounded by the frame 30. An inner perimeter P of the frame 30 has, as shown in a plan view FIG. 1F, at least a pair of opposing sides 32a and 32b, and four acute-angled portions 50 located at both ends of two sides. This will be explained in detail below. In FIG. 1A, for illustration purposes, the light emitting elements 20 and the light transmissive member 40 are indicated by solid lines. In FIG. 1F and FIG. 1G, rounded features of tips of portions 50 (illustrated by the arrow R in FIG. 1B, for example) are omitted for ease of understanding.

Mounting Board 10

The mounting board 10 is constructed by using an insulating material, such as a glass epoxy resin, a polyimide resin, ceramic, or glass. In the case of ceramic, it is preferable to use alumina, aluminum nitride, mullite, silicon carbide, silicon nitride, or the like, in order to increase the heat resistance of the mounting board 10. A shape of the mounting board 10 is, for example, a plate form.

Conductive wiring can be arranged on the mounting board 10. The one or more light emitting elements 20 are mounted on the conductive wiring arranged on a surface of the mounting board 10. Various sizes and shapes can be selected for the conductive wiring. Examples of conductive wiring materials include metals, such as copper, aluminum, gold, silver, tin, platinum, titanium, tungsten, palladium, iron, and nickel, as well as alloys including these. When using metal bumps to mount the light emitting elements 20, using gold on an outermost surface of the conductive wiring improves the adhesion between the bumps and the conductive wiring.

Light Emitting Element 20

The one or more light emitting elements 20 are mounted on the mounting board 10. Specifically, the one or more light emitting elements 20 are mounted on the wiring disposed on the mounting board 10. It is preferable to use light emitting diodes for the light emitting elements 20. For the light emitting elements 20, those having an emission wavelength in a given range between the ultraviolet region and the infrared region can be suitably selected in accordance with the applications of the light emitting device 1. Those having a stack structure, including an emitting layer, formed using various semiconductors, such as nitride semiconductors, for example, InN, AlN, GaN, InGaN, AlGaN, and InGaAlN, as well as group III-V compound semiconductors, group II-VI compound semiconductors, and the like, on a growth substrate, such as a sapphire substrate or a GaN substrate, can be used as the light emitting elements 20.

The light emitting elements 20 may have both the p-side electrode and the n-side electrode on the same surface, or have them so as to oppose one another. The light emitting elements 20 and the conductive wiring on the substrate 10 can be connected, for example, by wire bonding or the flip chip method. In the case of the flip chip method, for example, gold bumps can be used. The number of light emitting elements 20 arranged in the light emitting device 1 may be one or plural. In the case of arranging a plurality of light emitting elements 20, they are preferably arranged in order, such as in a matrix or checkerboard pattern, in order to reduce uneven light emission.

Frame 30

The frame 30 is configured by using a resin material. For the resin material, thermosetting resins and thermoplastic resins can be used. Specifically, silicone resins, modified silicone resins, epoxy resins, modified epoxy resins, acrylic resins, or hybrid resins containing at least one of these resins can be used. These resin materials preferably contain a light reflecting material, which reflects the light emitted by the light emitting elements 20. Examples of such light reflecting materials include $TiO_2$, $Al_2O_3$, $ZrO_2$, MgO, and BN.

The black dots in FIG. 1F and FIG. 1G are added to assist in understanding of the two sides 52 and 54 that form acute-angled portions 50, and are not part of a shape of the inner perimeter P of the frame 30. The black dots are merely provided for the sake of explanation, and in this embodiment, there are no clear borders between the sides 52 and 54 that form the acute-angled portions 50, and the sides 32a, 32b, 34a, and 34b. A rectangular region X, which will be described later, refers to the rectangular area indicated by the dotted line in FIG. 1F.

As shown in FIG. 1F and FIG. 1G, the inner perimeter P of the frame 30 has at least a pair of opposing sides 32a and 32b, and four acute-angled portions 50 located at the ends of the pair of opposing sides 32a and 32b in a plan view. In other words, the four acute-angled portions 50 are located on the outside of the four corners of the rectangular region X, which is in contact with the pair of opposing sides 32a and 32b. With this configuration, an area of the rectangular region X in contact with the pair of opposing sides 32a and 32b can be close to a total area that is surrounded by the frame 30. Accordingly, in the light emitting device 1 having the area surrounded by the frame 30 as an emission surface, a larger rectangular region X can be provided in the emission surface when compared to a conventionally-formed rectangular frame. The reason for this is explained below.

The frame 30 is formed, for example, by continuously dispensing an uncured resin material from a tip of a needle of a resin dispenser, followed by curing the dispensed resin material. The dispensed uncured resin material wets and spreads. Conventionally, when forming a rectangular frame on a plane using a resin material, a direction of travel of the needle is changed from one direction to another direction, which is perpendicular to the preceding direction, at the corners of the rectangle. At the corners, spreading of the resin material disposed along one direction and spreading of the resin material disposed along a perpendicular direction result into concentration of the resin material. For this reason, inner perimeter corners tend to be rounded. In other words, the inner perimeter corners of the area surrounded by the rectangular frame readily have rounded shape.

In Embodiment 1, the inner perimeter P of the frame 30 has four acute-angled portions 50 on the outside of the four corners of the rectangular region X, which is in contact with a pair of opposing sides 32a and 32b. For this purpose, instead of changing the needle's direction of travel at right angles along the outer edges of four corners of the rectangular region X, the needle is moved outwardly from the outer edges of the rectangular region X before reaching four corners of the rectangular region X, and the direction is changed on the outside of four corners. This allows for spreading of the resin material to accumulate at the corners of the inner perimeter P of the frame 30 within the acute-angled portions 50 that are located on the outside of the four corners of the rectangular region X. It is thus difficult for spreading of the resin material at the corners of the inner perimeter P to reach inside of the rectangular region X, which is in contact with the pair of opposing sides 32a and 32b. Accordingly, the area of the rectangular region X in contact with the pair of opposing sides 32a and 32b can be close to the total area that is surrounded by the frame 30. That is, a value obtained by "dividing the area of the rectangular region X in contact with the pair of opposing sides 32a and 32b by the total area surrounded by the frame 30" can be close to one. In the light emitting device 1, the area surrounded by the frame 30 serves as the emission surface, therefore, a larger rectangular region X can be provided in the emission surface when compared to a conventionally-formed rectangular frame.

Since the acute-angled portions 50 are located on the outside of the rectangular region X, the area of the rectangular region X is not affected by whether or not rounded features are formed at the tips of the acute-angled portions 50, i.e., between the sides 52 and 54. As such, it is preferable for the tips of the acute-angled portions 50 to have rounded features as in the case of Embodiment 1. This increases the contact area for the frame 30 made of a resin material with the mounting board 10 on which the frame 30 is formed, thereby increasing adhesion between the frame 30 and the mounting board 10.

The acute-angled portions 50 are parts of the area surrounded by the frame 30. The sides 52 and 54 that form acute-angled portions 50, are parts of the inner perimeter P of the frame 30. The internal angles d formed by the sides 52 and 54 that form the acute-angled portions 50, are acute angles. In other words, among the area surrounded by the frame 30, the portions in which the internal angles d formed by the sides 52 and 54 are acute angles are referred to as the acute-angled portions 50 in this embodiment.

The sides 52 and 54 forming the acute-angled portions 50 may individually be straight lines, curves, or a combination thereof. When both sides 52 and 54 are straight lines, the angles formed by the two straight lines represent the internal angles d at the acute-angled portions 50. When one of the two sides 52 and 54 forming the acute-angled portions 50 is a straight line while the other is a curve, the angle formed by the straight line and a line tangent to the curve at a given point on the curve represents the internal angle d of the acute-angle portion 50. When both sides 52 and 54 forming the acute-angled portions 50 are curves, the angle formed by the lines tangent to the curves at given points on the curves represents the internal angle d of the acute-angled portion 50. When one or both of the sides 52 and 54 forming the acute-angled portion is a curve, the value of the internal angle d varies depending on where the line tangent to the curve is drawn. It is preferable for the internal angle d formed by the lines including a tangent to be an acute angle no matter where the line tangent to the curve is drawn. This can reduce the areas of the portions of the area surrounded by the frame 30 excluding the rectangular region X, which is in contact with the pair of opposing sides 32a and 32b.

The light emitting device 1 has two pairs of opposing sides 32a and 32b, and 34a and 34b. The two pairs of opposing sides are all curves projecting towards an interior of the frame 30. In Embodiment 1, moreover, the sides 52 and 54 are also curves projecting towards the interior of the frame 30.

The side 52, which is one of the sides 52 and 54 forming an acute-angled portion 50, is located on an extension of the side 32a of the pair of opposing sides 32a and 32b, while the side 54 is located on the extension of the side 34a of the other pair of opposing sides 34a and 34b. In this manner, the area of the rectangular region X in contact with the pair of opposing sides 32a and 32b within the area surrounded by the frame 30 can be increased because the rectangular region X is also in contact with the other pair of opposing sides 34a and 34b, i.e., the rectangular region X is in contact with not only the sides 32a and 32b, but also the sides 34a and 34b.

It is preferable for the outer perimeter Q of the frame 30 to have four substantially arc-shaped outer perimeter corners 60 in a plan view. The four substantially arc-shaped outer perimeter corners 60 are located in correspondence with the acute-angled portions 50 of the inner perimeter P of the frame 30. That is, in Embodiment 1, the shapes of the corners of the frame 30 are acute-angled portions 50 for the inner perimeter P, and outer perimeter corners 60 for the outer perimeter Q. In a conventionally-formed frame having a rectangular shape in a plan view, stress normally concentrates at the corners of the rectangle. For this reason, separation of the frame 30 from the mounting board 10 tends to be initiated at the corners. Providing the frame 30 with four substantially arc-shaped outer perimeter corners 60, however, reduces stress at the corners. This can improve the adhesion between the frame 30 and the mounting board 10.

It is preferable for heights from the surface of the mounting board 10, or a surface of a member interposed between the mounting board 10 and the frame 30, to an upper edges of the frame 30, to essentially be uniform. The area surrounded by the frame 30 is to be filled with a light transmissive member 40. If heights of the upper edges of the frame 30 are not uniform, a portion of the light transmissive member 40 might leak from, or creep up walls of the frame 30, which reduces stability in the shape of the emission surface, i.e., an upper surface of the light transmissive member 40.

However, the outer perimeter corners 60 of the frame 30 may be formed higher than the other portions of the frame 30. In this manner, scratching and contamination of the emission surface can be reduced in the event that the light emitting device 1 is flipped over or stacked. This also reduces the instances of the emission surface being in contact with a packaging material when packaging the light emitting device 1. When the internal angle d at the acute-angled portions 50 are small, the needle tracks might partially overlap when forming the acute-angled portions 50. Where the needle tracks overlap, the resin member dispensed from the needle overlaps, which can consequently form the outer perimeter corners 60 of the frame 30 higher than the other portions of the frame 30.

Light Transmissive Member 40

The light transmissive member 40 encapsulates the area surrounded by the frame 30 for protecting the light emitting elements 20 from dust, moisture, and external forces. The light transmissive member 40 transmits the light emitted from the light emitting elements 20.

It is preferable to use a material likely to be resistant to the light emitted from the light emitting elements 20 for the light transmissive member 40. Specifically, it is preferable to use silicone resins, epoxy resins, urea resins, and the like. The light transmissive member 40 can contain fillers, such as phosphors and light diffusing agents, in accordance with the objectives. Examples of the phosphors include yellow phosphors, such as YAG ($Y_3Al_5O_{12}$:Ce) and silicate, and red phosphors, such as CASN ($CaAlSiN_3$:Eu) and KSF ($K_2SiF_6$: Mn). For light diffusing agents, for example, high light reflectance substances, such as $SiO_2$, $TiO_2$, $Al_2O_3$, $ZrO_2$, MgO, or the like can be suitably used. For the purpose of filtering out unwanted wavelengths, for example, an organic or inorganic coloring dye or pigment can be used as a filler.

As explained above, according to Embodiment 1, the area of the rectangular region X in contact with the pair of opposing sides 32a and 32b can be close to the total area surrounded by the frame 30. In other words, "the area of the rectangular region X divided by the area surrounded by the frame 30" can be made close to one. Accordingly, in the light emitting device 1, which includes the area surrounded by the frame 30 serving as the emission surface, a larger rectangular region X can be provided in the emission surface when compared to a light-emitting device having conventionally-formed rectangular frame.

Other examples of shapes of the inner perimeter P of the frame 30 will be explained with reference to FIG. 2A to FIG. 7B below. Similar to FIG. 1F, the rectangular areas indicated by dotted lines in FIGS. 2A, 3A, 4A, 5A, 6A, and 7A each representing a rectangular region X.

Another Example of the Shape of the Inner Perimeter P: Embodiment 2

Figure 2B:
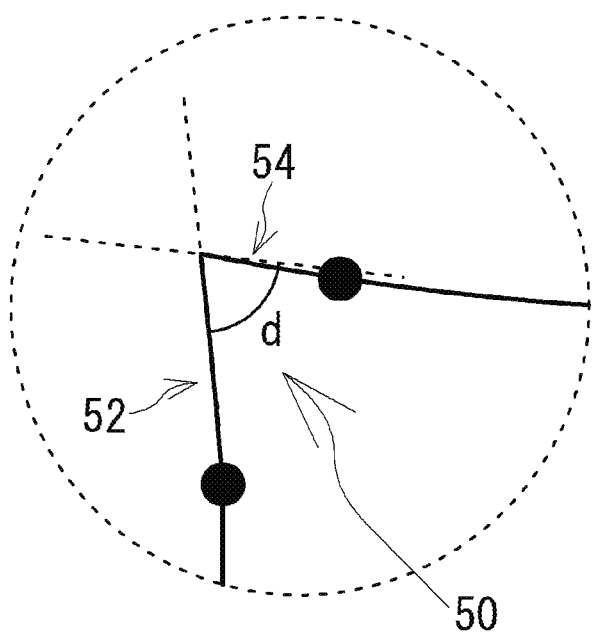
FIG. 2B is an enlarged view of a portion surrounded by a dotted line in FIG. 2A.

FIG. 2A is a schematic plan view illustrating a shape of an inner perimeter of a frame in Embodiment 2, and FIG. 2B is an enlarged view of a portion encircled by a dotted line in FIG. 2A. Embodiment 2 differs from the example explained in Embodiment 1 such that a pair of opposing sides 32a and 32b each has a straight-lined portion. According to Embodiment 2, the straight-lined portions of a pair of opposing sides 32a and 32b overlap with outer edges of a rectangular region X in contact with the pair of opposing sides 32a and 32b. Therefore, an area of the rectangular region X is even closer to a total area surrounded by a frame 30.

Another Example of the Shape of the Inner Perimeter P: Embodiment 3

Figure 3B:
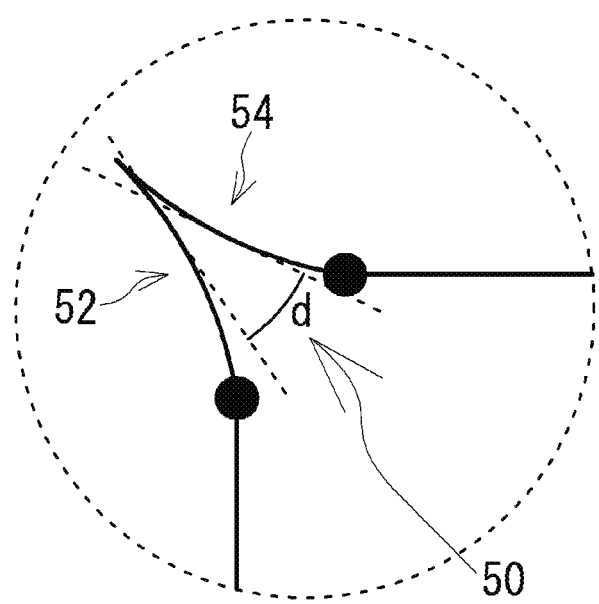
FIG. 3B is an enlarged view of a portion surrounded by a dotted line in FIG. 3A.

FIG. 3A is a schematic plan view illustrating a shape of an inner perimeter of a frame in Embodiment 3, and FIG. 3B is an enlarged view of a portion encircled by a dotted line in FIG. 3A. Embodiment 3 differs from Embodiment 1 such that both pairs of opposing sides 32a and 32b, and 34a and 34b have straight-lined portions. According to Embodiment 3, the straight-lined portions of the pairs of opposing sides 32a and 32b, and 34a and 34b overlap with outer edges of a rectangular region X in contact with the pairs of opposing sides 32a and 32b, and 34a and 34b. Therefore, an area of a rectangular region X is even closer to a total area surrounded by a frame 30.

Another Example of the Shape of the Inner Perimeter P: Embodiment 4

Figure 4B:
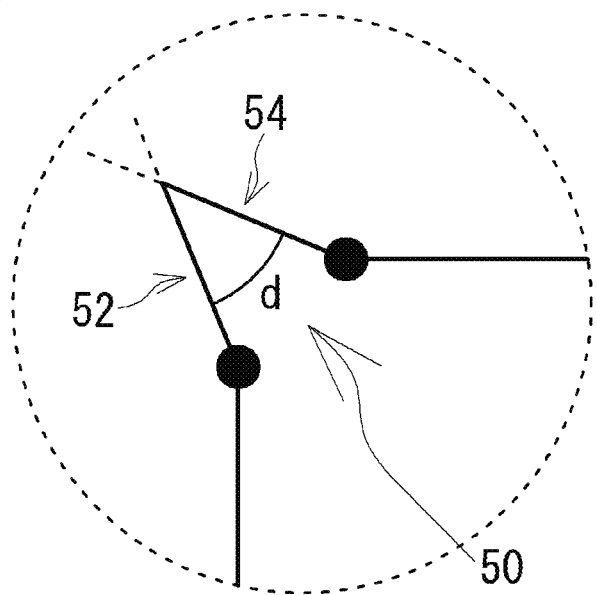
FIG. 4B is an enlarged view of a portion surrounded by a dotted line in FIG. 4A.

FIG. 4A is a schematic plan view illustrating a shape of an inner perimeter of a frame in Embodiment 4, and FIG. 4B is an enlarged view of a portion encircled by a dotted line in FIG. 4A. Embodiment 4 differs from Embodiment 1 such that both pairs of opposing sides 32a and 32b, and 34a and 34b have straight-lined portions, and sides 52 and 54 that form acute-angled portion 50 are both straight lines. Similar to Embodiment 3, Embodiment 4 can also bring an area of a rectangular region X even closer to a total area surrounded by a frame 30 by overlapping the straight-lined portions of the two pairs of opposing sides 32a and 32b, and 34a and 34b with outer edges of the rectangular region X in contact with the two pairs of opposing sides 32a and 32b, and 34a and 34b.

Another Example of the Shape of the Inner Perimeter P: Embodiments 5 and 6

Figure 5B:
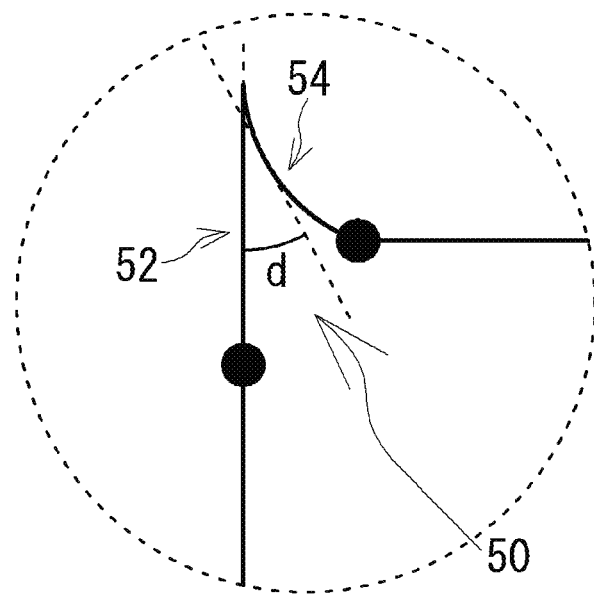
FIG. 5B is an enlarged view of a portion surrounded by a dotted line in FIG. 5A.
Figure 6B:
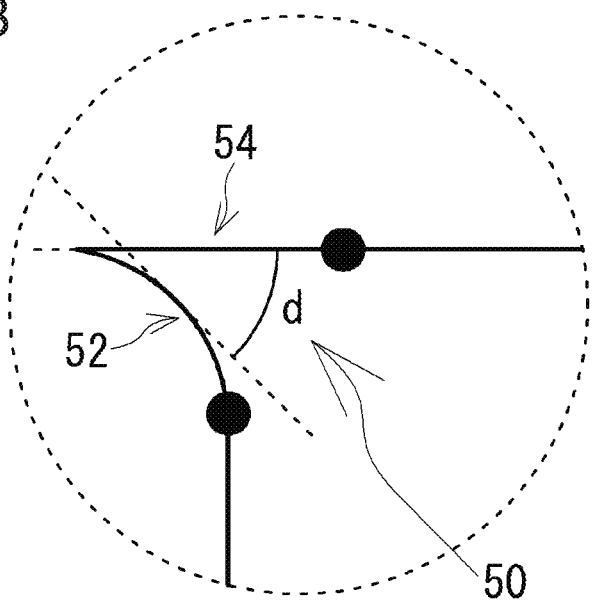
FIG. 6B is an enlarged view of a portion surrounded by a dotted line in FIG. 6A.

FIG. 5A is a schematic plan view illustrating the shape of an inner perimeter of a frame in Embodiment 5, and FIG. 5B is an enlarged view of a portion encircled by a dotted line in FIG. 5A. FIG. 6A is a schematic plan view illustrating a shape of an inner perimeter of a frame in Embodiment 6, and FIG. 6B is an enlarged view of a portion encircled by a dotted line in FIG. 6A. Embodiments 5 and 6 differ from Embodiment 1 such that both pairs of opposing sides 32a and 32b, and 34a and 34b have straight-lined portions, while one of sides 52 and 54 forming the acute-angled portion 50, is a straight line and the other side is a curve. According to Embodiments 5 and 6, an area of a rectangular region X in contact with the pairs of opposing sides 32a and 32b, and 34a and 34b can be even closer to a total area surrounded by the frame 30. Moreover, in Embodiment 5, the side 52 of the two sides forming the acute-angled portion 50 is a part of the pair of opposing sides 32a and 32b. In Embodiment 6, the side 54 of the two sides forming the acute-angled portion 50 is a part of the pair of opposing sides 34a and 34b. In this manner, the number of directional changes for the needle can be reduced when forming the frame 30.

Another Example of the Shape of the Inner Perimeter P: Embodiment 7

Figure 7B:
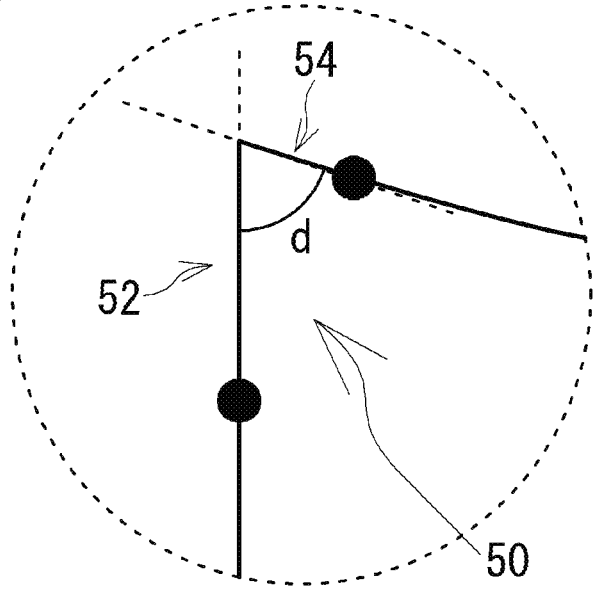
FIG. 7B is an enlarged view of the portion surrounded by the dotted line in FIG. 7A.

FIG. 7A is a schematic plan view illustrating a shape of an inner perimeter of a frame in Embodiment 7, and FIG. 7B is an enlarged view of a portion encircled by a dotted line in FIG. 7A. Embodiment 7 differs from Embodiment 1 such that a pair of opposing sides 32a and 32b have straight-lined portions, and both of sides 52 and 54 that form acute-angled portions 50 are straight lines. Even in the case of Embodiment 7, an area of a rectangular region X in contact with the pair of opposing sides 32a and 32b can be close to a total area surrounded by a frame 30.

Certain embodiments have been described above, but these descriptions in no way limit the constituent elements disclosed in the claims.

The surface light source devices using the light emitting devices according to the embodiments of the invention can be used, for example, as the light sources for use in projectors of head-up display devices, automotive illuminations such as headlights, lighting fixture light sources, backlight units for liquid crystal displays for use in television receivers and personal computers, small liquid crystal displays and cell phones.

What is claimed is:

1. A light emitting device comprising:
a mounting board;
one or more light emitting elements mounted on the mounting board;
a frame arranged to surround the one or more light emitting elements; and
a light transmissive member encapsulating an area surrounded by the frame,
wherein the frame has an inner perimeter that includes at least a pair of opposing sides and four acute-angled portions each provided at each end of the pair of opposing sides, in a plan view,
wherein an outer perimeter of the frame includes four substantially arc-shaped outer perimeter corners, in a plan view, the four substantially arc-shaped outer perimeter corners are located in correspondence with the four acute-angled portions of the inner perimeter of the frame to protrude outward in a plan view,
wherein a width between the inner perimeter of the frame and the outer perimeter of the frame is substantially the same throughout the frame excluding the four corners.

2. The light emitting device according to claim 1, wherein at least one of two sides forming each of the acute-angled portions is a curve.

3. The light emitting device according to claim 1, wherein two sides forming each of the acute-angled portions are curves.

4. The light emitting device according to claim 1, wherein each of the acute-angled portions has a rounded tip.

5. The light emitting device according to claim 1, wherein the outer perimeter corners of the frame are formed higher than other portions of the frame, with respect to a surface of the mounting board.

6. The light emitting device according to claim 1, wherein the pair of opposing sides each include a straight-lined portion.

7. The light emitting device according to claim 1, wherein the inner perimeter of the frame includes two pairs of opposing sides, and the two pairs of opposing sides each have a straight-lined portion.

8. The light emitting device according to claim 1, wherein the frame contains a light reflecting material.

9. The light emitting device according to claim 1, wherein the frame contains a silicone resin.

10. The light emitting device according to claim 1, wherein the light transmissive member contains a silicone resin.

11. The light emitting device according to claim 1, wherein the light transmissive member contains a phosphor.

12. The light emitting device according to claim 1, wherein at least one of two sides forming each of the acute-angled portions is curved inward.

13. The light emitting device according to claim 1, wherein at least one of two sides adjacent to each other and forming each of the acute-angled portions is curved inward.

\* \* \* \* \*